United States Patent
Billick et al.

(10) Patent No.: US 8,972,620 B2
(45) Date of Patent: Mar. 3, 2015

(54) METHODS AND SYSTEMS TO SIMPLIFY POPULATION OF MODULAR COMPONENTS IN AN INFORMATION HANDLING SYSTEM

(75) Inventors: Stephen Billick, Austin, TX (US); Robert Bassman, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 1019 days.

(21) Appl. No.: 12/829,722

(22) Filed: Jul. 2, 2010

(65) Prior Publication Data

US 2012/0001763 A1  Jan. 5, 2012

(51) Int. Cl.
- G06F 3/00 (2006.01)
- G08B 21/00 (2006.01)
- G06F 13/00 (2006.01)
- G06F 9/00 (2006.01)
- G06F 15/177 (2006.01)
- H05K 7/00 (2006.01)

(52) U.S. Cl.
CPC .............. G06F 15/177 (2013.01); G08B 21/00 (2013.01); G06F 9/00 (2013.01); H05K 7/00 (2013.01)
USPC ...... 710/17; 340/635; 711/105; 711/E12.078; 713/2

(58) Field of Classification Search
CPC ......... G06F 15/177; G06F 9/00; G08B 21/00; H05K 7/00
See application file for complete search history.

(56) References Cited

U.S. PATENT DOCUMENTS

| | | | | |
|---|---|---|---|---|
| 5,537,663 A | * | 7/1996 | Belmont et al. | 710/17 |
| 5,568,610 A | * | 10/1996 | Brown | 714/48 |
| 5,636,347 A | * | 6/1997 | Muchnick et al. | 710/302 |
| 5,802,328 A | * | 9/1998 | Yoshimura | 710/301 |
| 5,819,107 A | * | 10/1998 | Lichtman et al. | 710/8 |
| 6,047,343 A | * | 4/2000 | Olarig | 710/302 |
| 6,108,745 A | * | 8/2000 | Gupta et al. | 711/3 |
| 6,212,599 B1 | * | 4/2001 | Baweja et al. | 711/106 |
| 6,587,896 B1 | * | 7/2003 | Baldwin et al. | 710/13 |
| 6,636,943 B1 | * | 10/2003 | Stancil | 711/115 |
| 6,789,149 B1 | * | 9/2004 | Bhadsavle et al. | 710/302 |
| 7,340,359 B2 | * | 3/2008 | Erez et al. | 702/81 |
| 7,392,329 B2 | * | 6/2008 | Michaelis et al. | 710/8 |
| 7,487,413 B2 | * | 2/2009 | Lee et al. | 714/718 |
| 8,250,391 B2 | * | 8/2012 | Lee | 713/320 |
| 8,547,772 B2 | * | 10/2013 | Wu | 365/226 |
| 2004/0088636 A1 | * | 5/2004 | Cypher | 714/764 |
| 2004/0137462 A1 | * | 7/2004 | Chenchik et al. | 435/6 |
| 2005/0138267 A1 | * | 6/2005 | Bains et al. | 711/100 |
| 2005/0198449 A1 | * | 9/2005 | Haskell et al. | 711/156 |
| 2005/0253617 A1 | * | 11/2005 | Roberts et al. | 324/765 |
| 2006/0206764 A1 | * | 9/2006 | Lu et al. | 714/36 |
| 2006/0267577 A1 | * | 11/2006 | Erez et al. | 324/158.1 |
| 2008/0114558 A1 | * | 5/2008 | Erez et al. | 702/81 |
| 2010/0035461 A1 | | 2/2010 | Berke | |
| 2010/0067278 A1 | * | 3/2010 | Oh et al. | 365/51 |
| 2010/0115179 A1 | * | 5/2010 | Carr et al. | 711/103 |
| 2010/0164470 A1 | * | 7/2010 | Lee | 323/351 |

* cited by examiner

Primary Examiner — Henry Tsai
Assistant Examiner — Jing-Yih Shyu
(74) Attorney, Agent, or Firm — Baker Botts L.L.P.

(57) ABSTRACT

Systems and methods to simplify population of modular components in an information handling system are disclosed. A method of populating modular components in an information handling system comprises a first step of initializing a populating sequence. A first socket corresponding to a first modular component is then identified. The first socket is flagged if it does not contain the first modular component. The first modular component is then installed in the first socket which is flagged.

20 Claims, 5 Drawing Sheets

METHODS AND SYSTEMS TO SIMPLIFY POPULATION OF MODULAR COMPONENTS IN AN INFORMATION HANDLING SYSTEM

TECHNICAL FIELD

The present disclosure relates generally to information handling systems and, more particularly, to systems and methods to simplify population of modular components in an information handling system.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

One commonly used component of an information handling system is the system memory. The system memory may be volatile or non-volatile. A volatile memory component requires power to maintain the information stored therein. In contrast, a non-volatile memory component can retain stored information even when it is not powered. A common type of volatile memory is random access memory ("RAM") which is typically in the form of Static Random Access Memory ("SRAM") or Dynamic Random Access Memory ("DRAM"). These memory components are designed as integrated circuits and used in information handling systems. A series of DRAM integrated circuits may be combined to form a Dual In-line Memory Module ("DIMM"). These modules may be mounted on a printed circuit board and designed for use in an information handling system such as, for example, a personal computer, a work station or a server.

A printed circuit board in a typical information handling system may include a number of sockets. The different modular components used in the information handling system may then be "snapped" into these sockets, either during the manufacturing or at a later time by the user. With the increased complexity of information handling systems, the number of these sockets is on the rise.

U.S. patent application Ser. No. 12/187,513 entitled "System and Method for Detecting Module Presence in an Information Handling System," is incorporated herein by reference in its entirety, and discloses a method and system that detects a module's presence and proper insertion into a printed circuit board in an information handling system.

With the increased complexity of the information that is processed by an information handling system, the number of DIMMs in an information handling system is on the rise. The increased number of DIMMs in the system has made it more complicated to initially install or to upgrade the system memory. Moreover, many information handling systems include multiple central processing units ("CPU"). In multiple CPU systems memory must be installed in a particular order to achieve the maximum performance due to multiple memory channels. For example, an information handling system may use memory buffers and memory controllers. Some designs may use up to eight or more memory controllers. In such a system, the memory modules may need to be installed such that the memory controllers are in lock step, with each controller carrying an equal share of the load.

In order to meet the Chipset design guide for printed circuit board ("PCB") lay out requirements, DIMM sockets have to be located with their associated memory buffer. With the increasing number of modules used in an information handling system and considering the system requirements for arrangement of those modules, identifying the modular sockets to be populated may be difficult. Therefore, a method and system to simplify the population of the modular sockets in an information handling system is desirable.

SUMMARY

The present disclosure relates generally to information handling systems and, more particularly, to systems and methods to simplify DIMM population order in an information handling system.

In one exemplary embodiment, the present invention is directed to a method of populating modular components in an information handling system comprising: initializing a populating sequence; identifying a first socket corresponding to a first modular component; determining if the first socket contains the first modular component; flagging the first socket if it does not contain the first modular component; and installing the first modular component in the first socket if the first socket is flagged.

In another exemplary embodiment, the present invention is directed to a system for populating a plurality of modular components in an information handling system comprising: a first socket corresponding to a first modular component; a module detection circuit communicatively coupled to the first socket; wherein the module detection circuit detects presence of the first modular component in the first socket; a module logic circuit communicatively coupled to the module detection circuit and the first socket; wherein the module logic circuit notifies a user if the first modular component is not detected in the first socket.

Thus, the present disclosure provides systems and methods to simplify DIMM population order in an information handling system. Other technical advantages will be apparent to those of ordinary skill in the art in view of the specification, claims and drawings.

BRIEF DESCRIPTION OF THE DRAWING

A more complete understanding of the present embodiments and advantages thereof may be acquired by referring to the following description taken in conjunction with the accompanying drawing, in which like reference numbers indicate like features.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device or server, or any other suitable device and may vary in size, shape, performance, functionality, and price. The information handling system may include random access memory (RAM), one or more processing resources such as a central processing unit (CPU) or hardware or software control logic, read-only memory (ROM), and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Illustrative embodiments of the present invention are described in detail below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort would be a routine undertaking for those of ordinary skill in the art having the benefit of the present disclosure.

Figure 1:
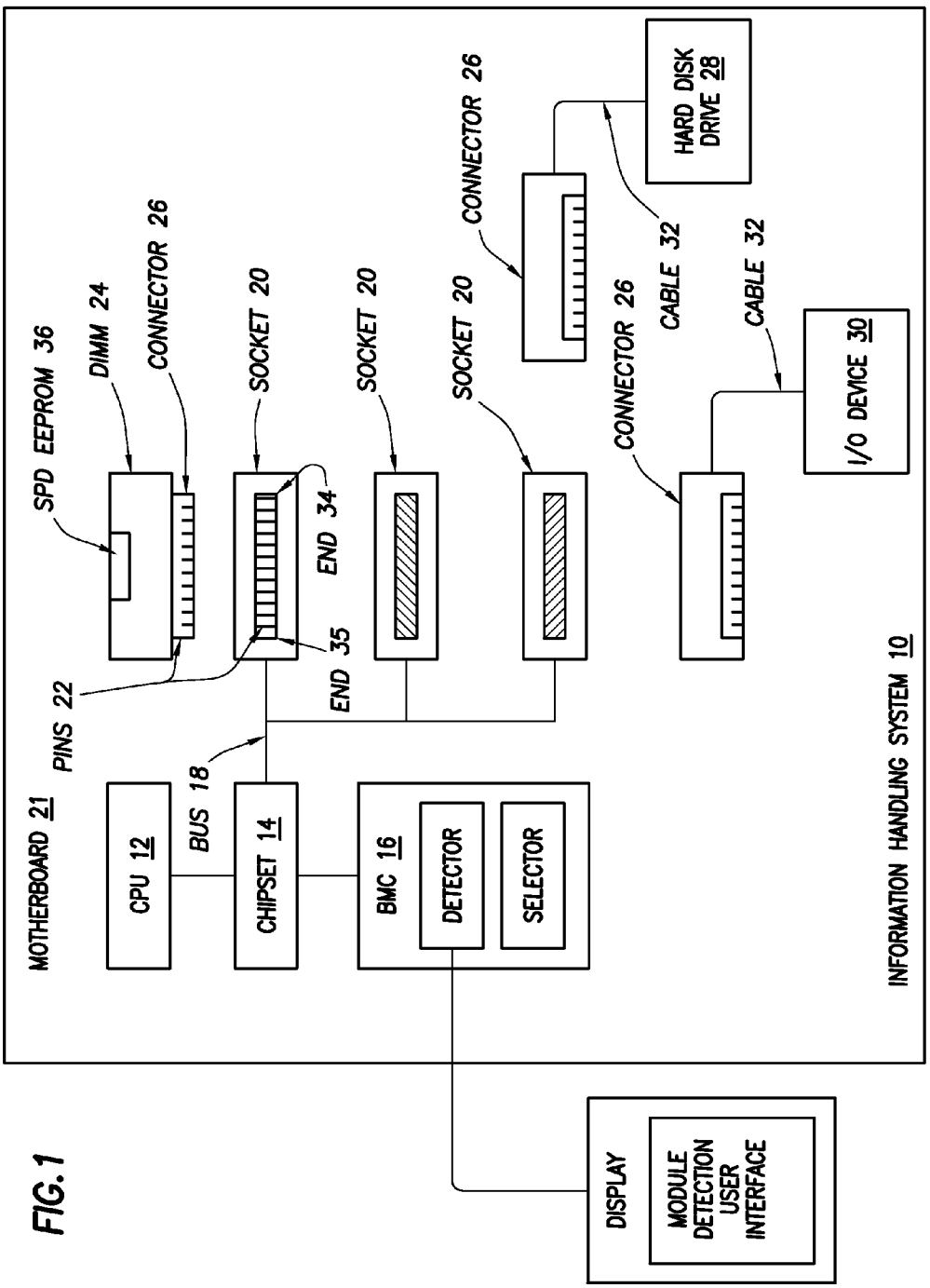
FIG. 1 is an information handling system equipped with a module presence detection system in accordance with an embodiment of the present invention.

Referring now to FIG. 1, a block diagram depicts an information handling system 10 having module presence detection. Information handling system 10 has a CPU 12 that performs processing operations and a chipset 14 interfaced with CPU 12 to manage interaction of CPU 12 with other components. Although the chipset 14 is depicted as being separate from the CPU 12 in FIG. 1, as would be appreciated by those of ordinary skill in the art, with the benefit of this disclosure, in one embodiment, the chipset may be integrated in the CPU itself. A baseboard management controller 16 provides out of band management of information handling system 10, such as remote power up and power down. A bus 18 provides communication of information between physical components of information handling system 10, such as communication of information between CPU 12 and memory or other devices inserted in sockets 20 disposed in a motherboard 21. Sockets 20 have pins 22 aligned to interface with pins of devices inserted into the sockets. One example of a device inserted into socket 20 is a memory module 24, such as a dual in-line memory module (DIMM). When a memory module 24 inserts into a socket 20, pins 22 exposed on a connector 26 align to communicate electrical signals with pins 22 within socket 20. Connector 26 engages socket 20 to hold memory module 24 in place. Similarly, as would be appreciated by those of ordinary skill in the art, with the benefit of this disclosure, other types of devices such as hard disk drives 28 and I/O devices 30 may be coupled to a connector 26 through a cable 32. The connector 26 may then operate as an interface to communicatively couple the hard disk drive 28 and/or I/O device 30 to the socket 20.

Using a DIMM as an example of a memory module 24, when a DIMM inserts into a socket 20, approximately 240 pins interface from a first end 34 of socket 20 to an opposing end 35. The 240 pins include a variety of data pins that communicate information and approximately 50 to 60 ground pins dispersed among the data pins. After insertion of a DIMM 24 into a socket 20, configuration information read from SPD EEPROM 36 via chipset 14 provides the CPU 12 with information needed to configure DIMM 24 for use.

Figure 2:
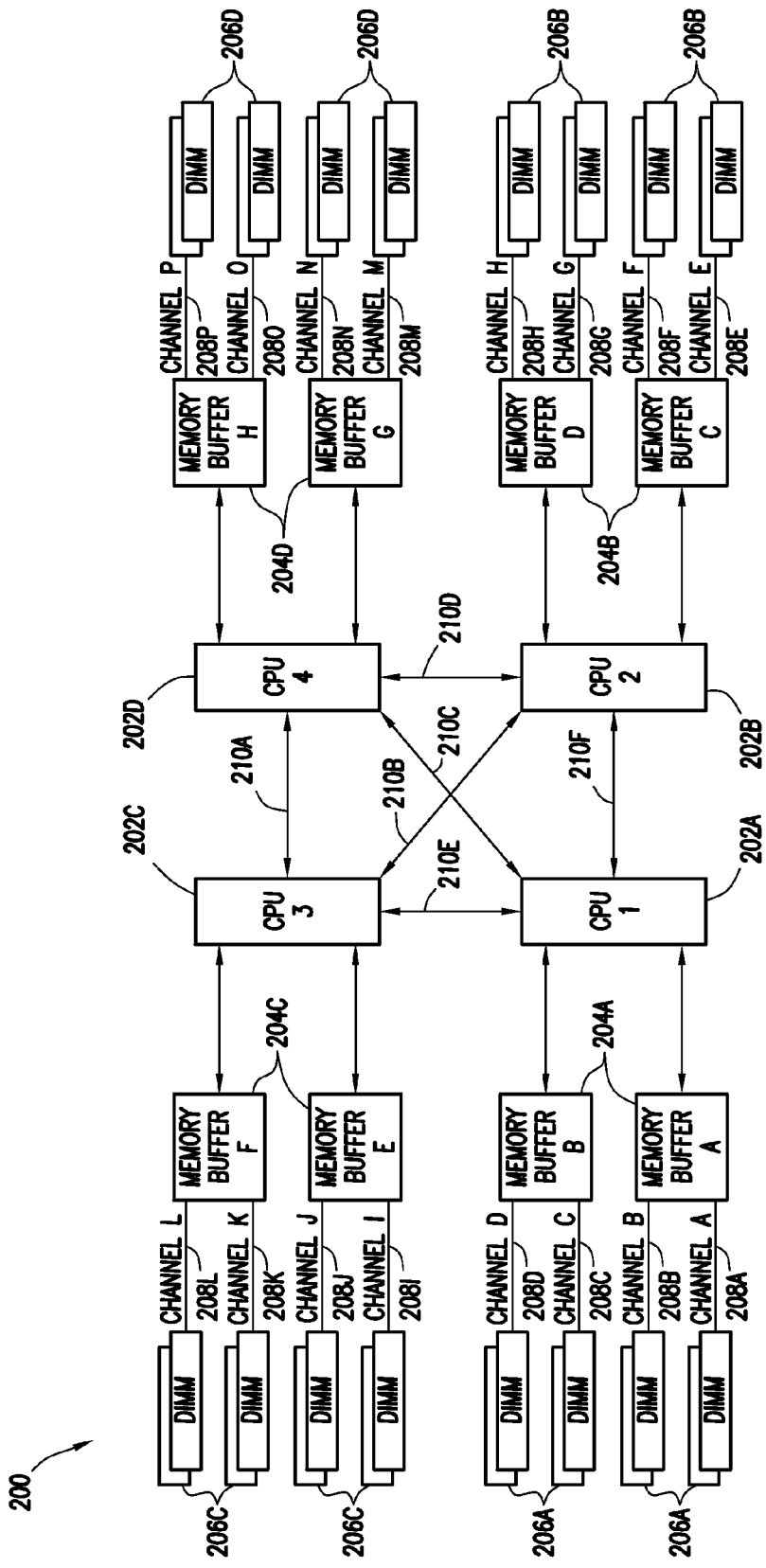
FIG. 2 is a schematic block diagram of the memory lay out in a multi processor information handling system in accordance with the prior art.

FIG. 2 depicts a schematic block diagram of the memory lay out in a multi processor information handling system in accordance with the prior art, denoted generally with reference numeral 200. In the exemplary embodiment of FIG. 2, the multi-processor system includes four CPUs 202A, 202B, 202C and 202D. As discussed above, with multi CPU systems, memory must be installed in a particular order to achieve the maximum performance due to multiple memory channels. For instance, as shown in FIG. 2, each CPU 202 may be associated with two corresponding memory buffers 204. As would be appreciated by those of ordinary skill in the art, with the benefit of this disclosure, each CPU 202 may contain a pair of memory controllers (not shown). Although FIG. 2 depicts a system with two memory buffers 204 associated with each CPU 202, as would be apparent to those of ordinary skill in the art, a fully configured system may include four memory buffers per CPU. In such a system, each of the pair of memory controllers (not shown) in a CPU 202 would be connected to two memory buffers 204 which are a lock-step pair. Because the memory buffers 204 have to be in lockstep, the same load has to be imposed on each memory buffer 204 pair. Moreover, in order to meet the PCB layout requirements, DIMM sockets 206 must be located with their associated memory buffer. Each memory buffer 204 may be connected to one or more DIMM sockets 206 through communication channels 208. Additionally, the CPUs 202 may be communicatively coupled to each other through communication channels 210. Accordingly, as shown in FIG. 2, a typical multi-processor information handling system includes a complex arrangement of sockets for modular components on the printed circuit board.

Figure 3:
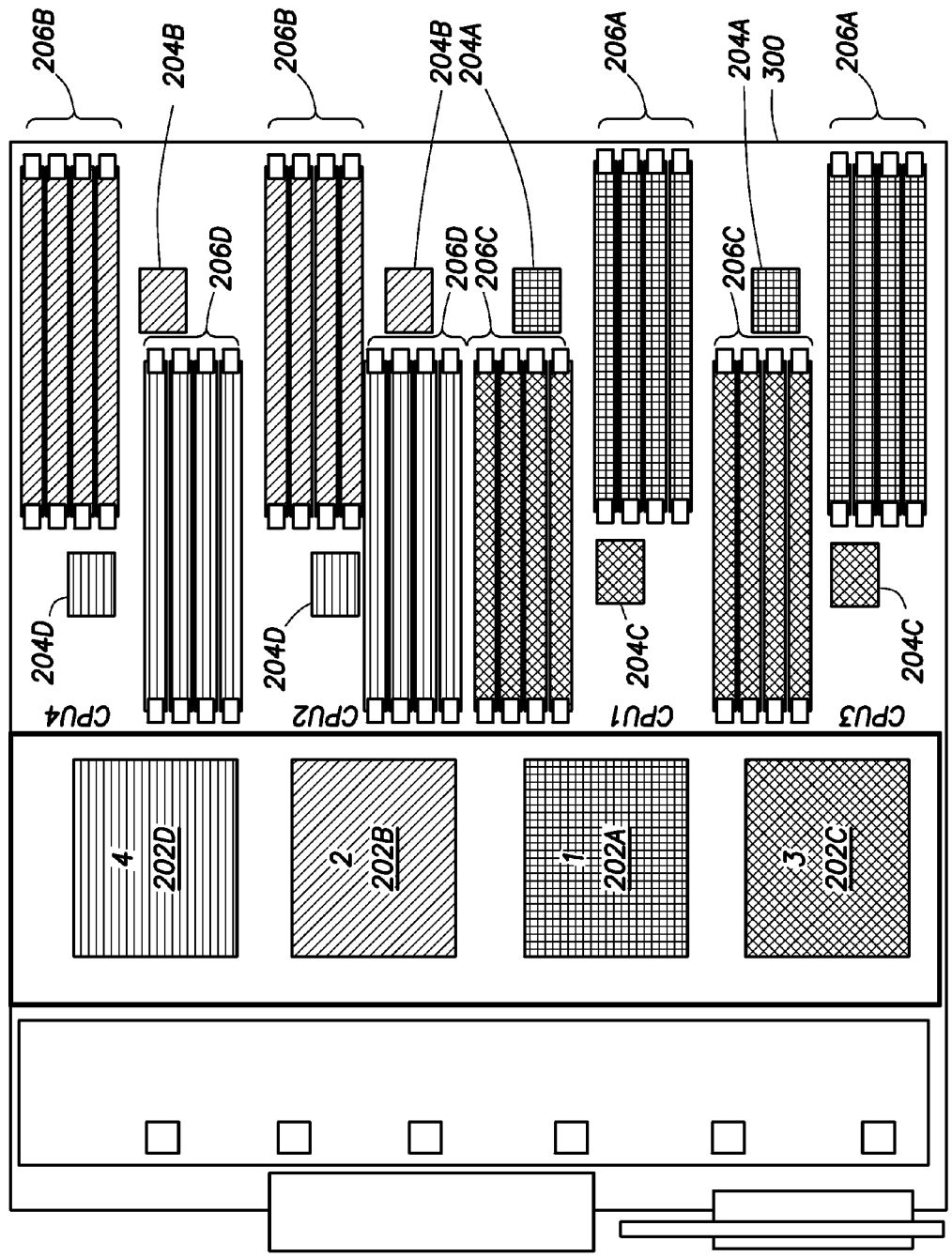
FIG. 3 depicts the lay out of the components of FIG. 2 on a printed circuit board.

FIG. 3 depicts the lay out of the components of FIG. 2 on a printed circuit board 300. As a result of the various system requirements and the complexity of the system design, as shown in FIG. 3, the arrangement of the DIMM modules 206 on the printed circuit board 300 is typically not in sequential order. Due to the non-sequential positioning of the DIMM sockets, populating those sockets, especially in an information handling system with a complex lay out of components is often a difficult task.

Figure 4:
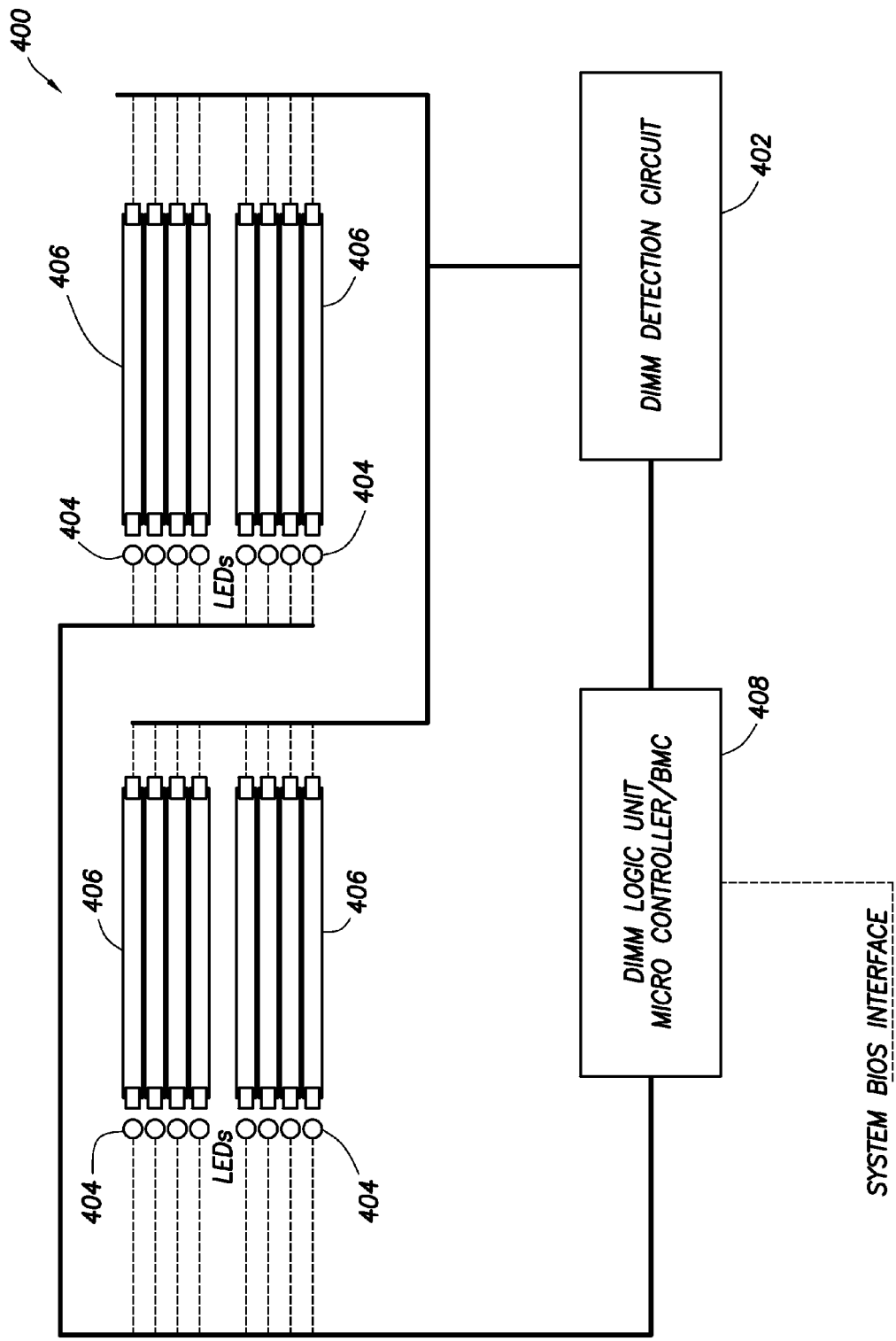
FIG. 4 is a block diagram representation of a system in accordance with an exemplary embodiment of the present invention.

FIG. 4 depicts a system in accordance with an exemplary embodiment of the present invention, denoted generally with reference numeral 400. The system includes a DIMM detection circuit 402 and Light Emitting Diodes (LEDs) 404 connected to each DIMM socket 406. The operation of the DIMM detection circuit is discussed in detail in U.S. application Ser. No. 12/187,513 which is incorporated herein by reference in its entirety. Specifically, the DIMM detection circuit 402 checks the left and right sides of the DIMM socket 406 and determines whether a DIMM module is present in each socket or not.

Figure 5:
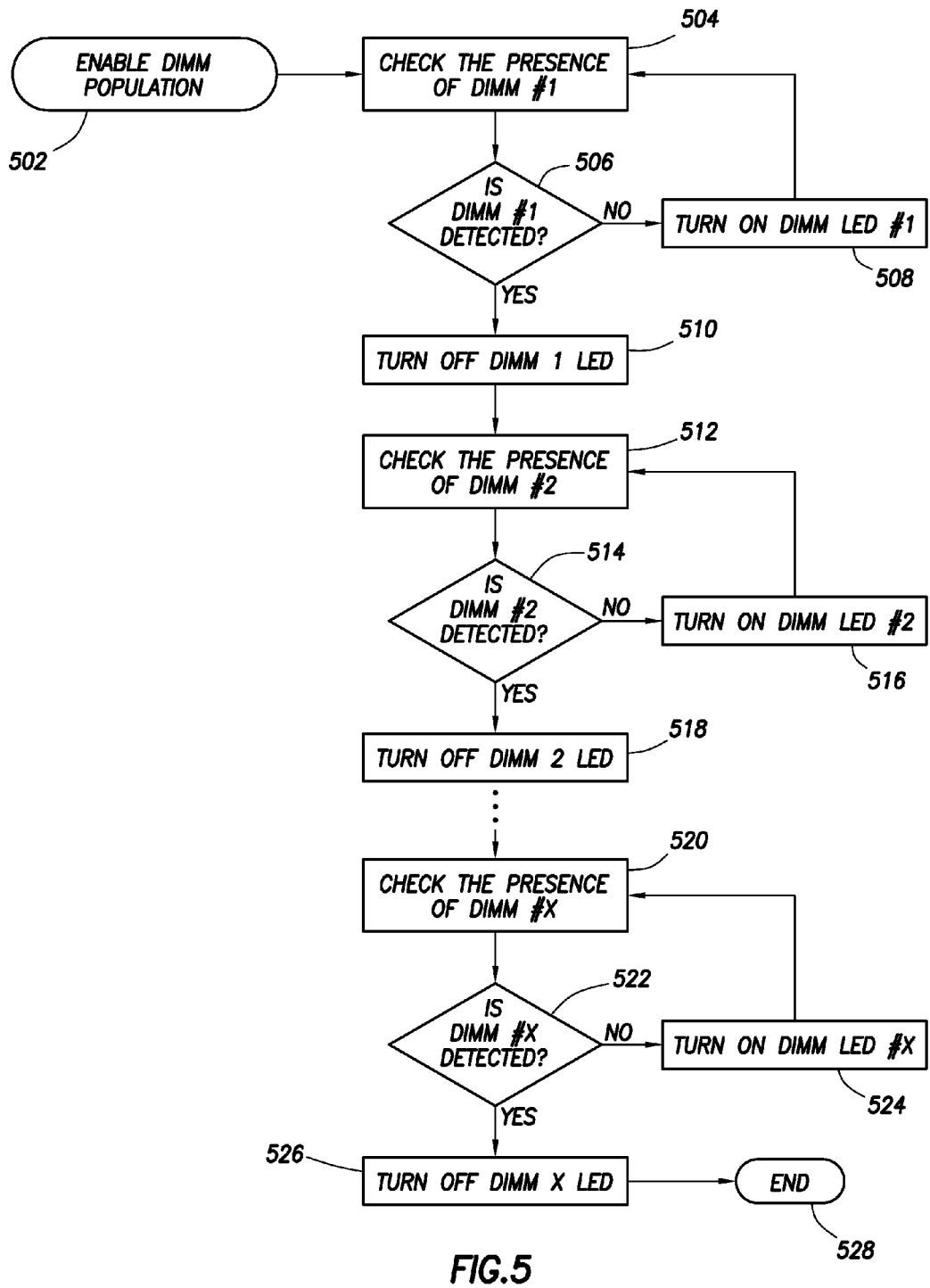
FIG. 5 is a flow chart of the steps carried out by a DIMM logic circuit in accordance with an embodiment of the present invention.

The system 400 further includes a DIMM logic circuit 408. As would be appreciated by those of ordinary skill in the art, with the benefit of this disclosure, the DIMM logic circuit 408 may be a low cost microcontroller or discrete logic. In one exemplary embodiment, the system 400 may be battery powered. FIG. 5 depicts a flow chart of the steps carried out by the DIMM logic circuit 408.

When desirable, for example, when a user desires to upgrade the memory of the information handling system, the user may enable the DIMM logic circuit 408 to start the DIMM population sequence at step 502. As would be appreciated by those of ordinary skill in the art, with the benefit of this disclosure, the DIMM logic circuit 408 may be enabled in a number of ways such as, for example, through a jumper or a BIOS setting. As would be appreciated by those of ordinary skill in the art, the use of BIOS setting to enable the DIMM logic circuit 408 would typically require the presence of memory to allow set up. Accordingly, in one embodiment of the present invention an interactive LCD screen that may be controlled by the BMC may be used to enable the DIMM logic circuit 408. As would be appreciated by those of ordinary skill in the art, with the benefit of this disclosure, unlike a typical BIOS setting, such an interactive LCD screen may be available for use before the system is ever powered up, making it more desirable for certain applications. Once the DIMM population sequence is initiated at step 502, the DIMM detection circuit 402 will check the presence of a DIMM in a first DIMM socket, DIMM#1, at step 504. As would be appreciated by those of ordinary skill in the art, with the benefit of this disclosure, the DIMM sockets in the information handling system may be considered in any desired order. Accordingly, the DIMM logic circuit 408 may consider the DIMMs 406 in any desired order.

Next, at step 506 it is determined whether the DIMM detection circuit 402 detected a DIMM in the particular socket. If no DIMM is detected in the particular socket corresponding to DIMM#1, at step 508, the DIMM logic circuit 408 will turn on the Light LED 404 corresponding to that particular DIMM socket 406 corresponding to DIMM#1. As would be appreciated by those of ordinary skill in the art, with the benefit of this disclosure, in a system that has multiple memory buffers, where two DIMMs may need to be installed in lock step, the DIMM logic circuit 408 may enable two LEDs. Steps 504, 506 and 508 are then repeated until the socket corresponding to DIMM#1 has been populated. Specifically, once DIMM#1 is detected, the DIMM logic circuit 408 will turn off the LED corresponding to DIMM#1 at step 510.

Next, the DIMM detection circuit 402 will check the presence of a DIMM in a second DIMM socket, DIMM#2, at step 512. At step 514 it is determined whether the DIMM detection circuit 402 detected a DIMM in the particular socket. If no DIMM is detected in the particular socket corresponding to DIMM#2, at step 516, the DIMM logic circuit 408 will turn on the LED 404 corresponding to that particular DIMM socket 406 corresponding to DIMM#2. Steps 512, 514 and 516 are then repeated until the socket corresponding to DIMM#2 has been populated. Specifically, once DIMM#2 is detected, the DIMM logic circuit 408 will turn off the LED corresponding to DIMM#2 at step 518.

Accordingly, as shown in FIG. 5, the same iterations may be carried out for the remaining DIMM sockets 406 with the DIMM detection circuit 402 finally checking the presence of the last DIMM at step 520. If a DIMM is not detected in the last socket to be analyzed at step 522, the LED corresponding to that DIMM is turned on at step 524 and cycle repeats until a DIMM is detected in that socket 406. Once a DIMM is detected, the last LED is turned off at step 526 and the process terminates at step 528.

Although the present invention is discussed in the context of DIMMs, as would be appreciated by those of ordinary skill in the art with the benefit of this disclosure, the method and systems disclosed herein may be used in conjunction with populating any modular component of an information handling system that is to be installed in a socket on the printed circuit board.

Accordingly, the present disclosure provides to simplify population of modular components in an information handling system. Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee. The indefinite articles "a" or "an," as used in the claims, are each defined herein to mean one or more than one of the element that it introduces.

What is claimed is:

1. A method of populating modular components in an information handling system comprising:

receiving an enable setting at an interactive LCD screen, wherein the enable setting is indicated by a software or hardware setting, and wherein the enable setting enables a logic circuit;

controlling the interactive LCD screen by a controller;

initializing a populating sequence with respect to the modular components, wherein the logic circuit initializes the populating sequence and wherein the modular components are initialized in any order;

identifying a first socket corresponding to a first modular component;

determining if the first socket contains the first modular component;

flagging the first socket when it does not contain the first modular component;

installing the first modular component in the first socket when the first socket is flagged; and reading configuration information for the first modular component from a memory if the first modular component is installed.

2. The method of claim 1, wherein flagging the first socket comprises illuminating a light emitting diode associated with the first socket.

3. The method of claim 1, wherein the first modular component is a memory module.

4. The method of claim 3, wherein the memory module is a DIMM.

5. The method of claim 1 further comprising:
identifying a second socket corresponding to a second modular component;
determining if the second socket contains the second modular component;
flagging the second socket when it does not contain the second modular component; and
installing the second modular component in the second socket if when the second socket is flagged.

6. The method of claim 5, wherein the second modular component is a memory module.

7. The method of claim 5, wherein flagging the second socket comprises illuminating a light emitting diode associated with the second socket.

8. The method of claim 1, wherein the populating sequence is initiated by one of a BIOS setting and an interactive Liquid-Crystal Display (LCD) screen.

9. The method of claim 1, wherein the information handling system is a server.

10. A system for populating a plurality of modular components in an information handling system comprising:
a first socket corresponding to a first modular component;
a module detection circuit communicatively coupled to the first socket, wherein the module detection circuit detects presence of the first modular component in the first socket;
an interactive LCD screen, wherein the interactive LCD screen is configured to receive an enable setting, wherein the enable setting is indicated by a software or hardware setting;
a controller for controlling the interactive LCD screen;
a module logic circuit communicatively coupled to the module detection circuit and the first socket, wherein the module logic circuit when enabled as indicated by the enable setting, initializes a populating sequence with respect to the first modular component;
wherein the module logic circuit notifies a user when the first modular component is not detected in the first socket; and
a memory communicatively coupled to the first modular component, wherein configuration information is read from the memory when the first modular component is detected.

11. The system of claim 10, further comprising:
a second socket corresponding to a second modular component;
wherein the second socket is communicatively coupled to the module detection circuit;
wherein the module detection circuit detects presence of the second modular component in the second socket;
wherein the second socket is communicatively coupled to the module logic circuit; and
wherein the module logic circuit notifies a user if the second modular component is not detected in the second socket.

12. The system of claim 11, wherein the module logic circuit illuminates a Light Emitting Diode (LED) to notify the user if the first modular component is not detected in the first socket.

13. The system of claim 11, wherein the module logic circuit illuminates a Light Emitting Diode (LED) to notify the user if the second modular component is not detected in the second socket.

14. The system of claim 10, wherein the first modular component is a memory module.

15. The system of claim 14, wherein the memory module is a DIMM.

16. The system of claim 10, wherein the first modular component is a hard disk drive.

17. The system of claim 10, wherein the first modular component is communicatively coupled to the first socket by a connector.

18. The system of claim 10, wherein the modular logic circuit is a microcontroller.

19. The system of claim 10, wherein the modular logic circuit is battery powered.

20. The system of claim 10, wherein the first modular component is an I/O device.

* * * * *